_United States Patent_ [19]

Hawkins

[11] 4,018,981

[45] Apr. 19, 1977

[54] ELECTRICAL COMPONENT PACKAGE

[75] Inventor: Harold G. Hawkins, Bristolville, Ohio

[73] Assignee: General Motors Corporation, Detroit, Mich.

[22] Filed: May 17, 1976

[21] Appl. No.: 686,694

[52] U.S. Cl. .......................... 174/52 R; 339/147 R; 339/210 R
[51] Int. Cl.² .......................................... H05K 5/00
[58] Field of Search ........... 174/52 R, 50; 337/201, 337/213, 214, 215; 338/220, 232; 339/147 R, 147 C, 91 R, 206 R, 59 R, 59 M, 210 R

[56] References Cited

UNITED STATES PATENTS

| | | | |
|---|---|---|---|
| 3,117,829 | 1/1964 | Leach | 339/210 R X |
| 3,332,053 | 7/1967 | Busler | 339/210 R |
| 3,354,454 | 11/1967 | Rueger | 174/52 R |
| 3,391,383 | 7/1968 | Antes | 339/174 |
| 3,673,543 | 7/1972 | Garner | 339/61 M |
| 3,813,636 | 5/1974 | Mason | 339/59 R |
| 3,842,388 | 10/1974 | Harwood et al. | 339/59 R |

_Primary Examiner_—J. V. Truhe
_Assistant Examiner_—David A. Tone
_Attorney, Agent, or Firm_—Herbert Furman

[57] ABSTRACT

An electrical component package includes a housing having a pair of open ended terminal receiving passages and a cavity intermediate the inner ends of the passages for receiving the body of the component. The bent leads of the component are received in grooves located outwardly of the passages. A cover is integrally hinged to the housing and includes a pair of flanges which cover the grooves and component leads when the cover is in closed position. The cover further includes a pair of cavities which open to the inner ends of the terminal receiving passages when the cover is in closed position and an opening through the cover intermediate the cavities to permit viewing of the body of the component. Cooperating shoulders on the cover and housing maintain the cover in closed position. After assembly of the electrical component within the housing, female terminals can be inserted through the passages and electrically connected to the component leads. The terminals are housed both in the passages and in the cavities of the cover. Cooperating shoulders of the terminals and of the passages releasably locate the terminals within the passages. After connection of the terminals to the component leads, an integral flap of the cover can be moved to a closed position wherein detents of the flap extend through lateral passages of the housing and into the terminal receiving passages to block withdrawal of the terminals and also releasably maintain the flap in closed position.

3 Claims, 5 Drawing Figures

U.S. Patent
April 19, 1977
4,018,981
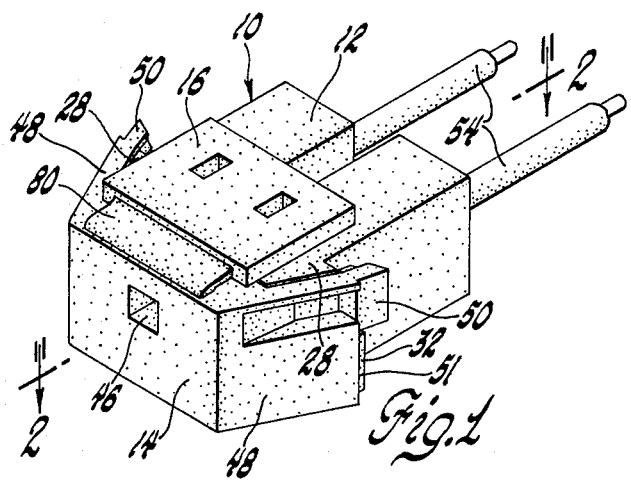
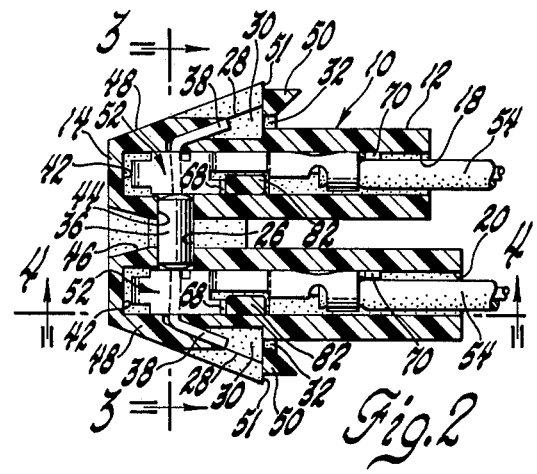

ELECTRICAL COMPONENT PACKAGE

This invention relates generally to a one piece package for an electrical component and more particularly to such a package which permits the component to be assembled within the package and to be subsequently connected to and disconnected from leads.

It is known to provide housings for electrical components and also to provide a package including a housing receiving the component and an integral closure for covering the component after assembly. However, such packages require that the leads be assembled to the component either prior to assembly of the component and package, or simultaneously with such assembly. This requires that the assembled component and leads be assembled and subsequently handled as a unit as well as requiring that the lead length be predetermined.

The package of this invention provides for assembly of the electrical component within a housing having an integrally hinged cover. However, the package differs from the prior art in permitting the component to be electrically connected to and disconnected from the lead terminals after assembly of the component and package. The package cooperates with the terminals in effecting the electrical connection and also in preventing inadvertent electrical disconnection.

In the preferred embodiment of the invention, the package includes a housing having open ended terminal receiving passages and a cavity between the inner ends of the passages for receiving the body of the electrical component. The component leads cross the inner ends of the passages and integral grooves located outwardly of the passages releasably receive the bent ends of the leads to assemble the component and housing. An integrally hinged cover can be moved to a closed position wherein terminal receiving cavities of the cover close the inner ends of the housing passages, and flanges of the cover overlie the grooves and the component leads. Integral shoulders of the cover snap over like shoulders of the housing to retain the cover in closed position. This completes the assembly of the package and component into an easily handled module and also permits lead attachment whenever desired.

When it is desired to attach leads to the component, female terminals with attached leads are inserted into the terminal receiving passages of the housing. The end portions of the terminals releasably engage the component leads and extend beyond the inner ends of the passages and into the cavities of the cover. Cooperating shoulders on the terminals and on the passage walls releasably locate the terminals against both inward and outward movement within the passages. An integrally hinged flap of the cover can be moved to a closed position after connection of the terminals to the component leads. Integral lugs of this flap cooperate with certain of the terminal shoulders to positively prevent removal of the terminals. An opening in the cover permits viewing of the component body to insure that such component has been installed.

It can be seen from the foregoing that the electrical component can be installed in the housing and the cover moved to a closed position to provide a packaged component which is easily and simply handled as a modular unit. Whenever it is necessary to connect the component into a circuit, the terminals and the leads of whatever length is required can then be assembled to the component and the flap of the cover moved to closed position to thereby complete the assembly of the component and leads.

The primary feature of this invention is that it provides an improved one piece package for an electrical component which provides for ease of connection and disconnection of the component leads and the terminals of exterior leads after the component has been packaged. Another feature of the package includes a housing which accurately locates both the component and the component leads and releasably holds them in position by an integrally hinged cover which is movable between open and closed positions with respect to the housing. A further feature is that the housing includes terminal receiving passages which receive inserted terminals of exterior leads and guide such terminals into electrical connection with the component leads. Yet another feature is that the terminals are releasably locked in position when positive electrical connection of the terminals and component leads has occurred. Yet a further feature is that the cover includes an integrally hinged flap which can only be moved to closed position when electrical connection of the component leads and terminals has occurred and which is cooperable in closed position with the housing and terminals to positively block inadvertent withdrawal of the inserted terminals. Still another feature is that the exterior lead terminals can be easily disconnected from the component leads without affecting the assembly of the component and package.

These and other features will be readily apparent from the following specification and drawings wherein:

FIG. 1 is a perspective view of a package according to this invention, including a housing having an associated cover and flap in closed position, and a diode within the housing connected to terminals of exterior leads.

FIG. 2 is a sectional view taken generally along the plane indicated by line 2—2 of FIG. 1.

FIG. 3 is a sectional view taken generally along the plane indicated by line 3—3 of FIG. 2.

FIG. 4 is a sectional view taken generally along the plane indicated by line 4—4 of FIG. 2, and FIG. 5 is an exploded perspective view of the housing, diode, terminals and leads.

Referring now particularly to FIG. 5 of the drawings, a package designated generally 10 according to this invention includes a molded housing 12 of insulating material, a cover 14 integrally hinged to the housing and a flap 16 integrally hinged to the cover 14. The housing 12 includes a pair of terminal receiving passages 18 and 20 each of which includes a narrower portion 22 and a wider portion 24. Passage 18 is shorter than passage 20. A semi-cylindrical cavity 26 extends between the inner ends of the passages 18 and 20. The housing 12 further includes integral triangular shoulders 28 which are located outwardly of the inner ends of the passages 18 and 20 and each of which is bisected by a transverse groove 30. The shoulders further include integral lateral flanges 32 to one side of the grooves 30. Cylindrical grooves 34 extend from the grooves 30 across the outer walls of the housing 12.

As shown in FIG. 2, a diode or electrical component 36 has the body thereof received within the cavity 26. The leads 38 of the component extend outwardly of the body and across passages 18 and 20 and through the grooves 34. The bent ends of the leads are located within the grooves 30, FIG. 2. The grooves 30 are generally of slightly less width than the diameter of the leads 38 to thereby releasably retain the leads in the grooves and in turn releasably retain the body of diode 36 in the cavity 26.

The cover 14 is integrally hinged to the housing 12 at 40. The cover includes a pair of cavities 42, a semi-cylindrical cavity 44 therebetween, and an opening 46 to cavity 44. When the diode has been assembled within housing 12 and cover 14 moved to a closed position as shown in FIG. 2, the cavities 42 close the inner ends of respective passages 18 and 20. The cavity 44 is complementary to the cavity 26 and cooperates therewith in resiliently gripping the body of the diode 36. The opening 46 permits viewing of the diode after cover 14 is closed to insure that the diode has been installed within the housing. The cover further includes integral angular flanges 48, each of which is provided with a flexible detent shoulder 50. When the cover is moved to a closed position the edges 51 of flanges 48 abut the flanges 32 of housing 12 while the shoulders 50 snap over and behind shoulders 28, FIG. 2, to releasably retain the cover 14 in closed position. The cover 14 closes grooves 34 and inner surfaces of the flanges 48 mate with the outer surfaces of the shoulders 28 and cover the grooves 30 to insure retention of the diode leads therein. Thus, when cover 14 is closed, the diode and package are assembled into an easily handled module which can thereafter be connected to and disconnected from the terminals of exterior leads as will now be described.

A female terminal 52 and attached exterior lead 54 is respectively inserted within a passage 18 or 20 when it is desired to connect the diode 36 in a circuit. As best shown in FIG. 5, the terminal 52 includes a flanged body 56 which is crimped at 58 to the exposed wire of the lead and at 60 to the lead itself. The body 56 includes a pair of integral U-shaped bent legs 62 each of which terminates in a lateral flange 64 juxtaposed to the body flange. The terminal body further includes a lanced deflectable leg 66 and a lanced deflectable flanged leg 68. A pair of guide flanges 70, FIG. 4, extend laterally of the terminal body adjacent the crimp 60.

When a terminal 52 is inserted within its respective passage 18 or 20, the flanged body 56 of the terminal fits both within the narrower portion 22 and wider portion 24 as shown in FIGS. 3 and 4. The guide flanges 70 are slightly spaced from the opposite side walls of the narrower portion 22 while the leg 66 and flange 68 move within the wider portion 24. As best shown in FIG. 4, one side wall of the wider portion includes a ramped shoulder 72 and the other side wall includes a lateral shoulder 74 which provides one wall of a lateral passage 76 opening outwardly of the housing 12. The deflectable leg 66 of the terminal rides over and behind the shoulder 72 while the flanged leg 68 of the terminal engages the shoulder 74 to thereby releasably locate the terminal in a positively connected position against movement both inwardly and outwardly of the passage. When the terminal is in this position, the legs 62 of the terminal resiliently grasp a respective lead 38 of the diode 36 to electrically connect the diode across the leads 54. The legs 62 extend outwardly of a respective passage 18 or 20 and into a cavity 42 of the cover 14. Since the diode 36 is clamped in position by cover 14 when the cover is closed, the diode leads 38 are firmly held in position across a respective passage 18 or 20 and it is easy for the terminal legs 62 to move past the diode leads as the terminal moves to the positively connected position. The flanges 64 of legs 62 abut the flange body 56 of the terminal of enhance the gripping action of the legs 62.

The shoulders 72 are located adjacent openings 78 in the housing 12 to permit a suitable tool to be inserted so as to engage the legs 66 and deflect them out of engagement with the shoulder 72 so that the terminals can be removed whenever desired.

Flap 16 is integrally hinged at 80 to the cover 14. When the terminals are in their positively connected position as shown in FIG. 4, the flap can be moved from the open position of FIG. 5 to the closed position shown in FIGS. 1 and 4 wherein integral deflectable shouldered tabs 82 of the cover extend through the passages 76 and into the interior of the passages 18 and 20 to block outward movement of legs 68 even if legs 66 are deflected out of engagement with shoulders 72. The shoulders of tabs 82 engage over the upper walls of the passages 18 and 20, as viewed in FIGs. 4 and 5, to thereby releasably retain the flap in closed position and lock the terminals against withdrawal.

From the foregoing description it can be seen that the diode or electrical component 36 can be assembled within the housing 12 and the cover 14 moved to a closed position to thereby package the component. Whenever desired, the female terminals and their attached leads can be inserted within the module of the component and package and easily electrically connect the component across the leads. By closing the flap 16, the terminals are locked in place against withdrawal. If the terminals are not positively electrically connected to the component leads, flat 16 cannot be closed because legs 68 will block passages 76. By providing for attachment of the terminals and leads to the component subsequent to packaging of the component, the packaged component can be easily handled and the lead length can be determined whenever the packaged component is installed.

Thus this invention provides an improved electrical component package.

What is claimed is:

1. A once piece housing for packaging an electrical component body and connecting the component leads to terminals after packaging comprising, in combination, a housing of insulating material having a pair of open ended terminal receiving passages, a cavity intermediate the passages for receiving the body of the component, a groove in the housing outwardly of each passage for receiving a respective lead of the component when the component body is in the body receiving cavity, a cover integrally hinged to the housing and including a pair of flanges, each covering a groove and component lead therein when the cover is in closed position, cooperating means on the cover and housing for latching the cover in closed position, a flap integrally hinged to the cover, and means on the flap extending transversely into the terminal receiving passages of the housing when the flap is in closed position and engageable with terminals in the passages to lock the terminals against withdrawal and maintain the flap in closed position relative to the housing.

2. A one piece housing for packing an electrical component body and connecting the component leads to terminals after packaging comprising, in combination, a housing of insulating material having a pair of open ended terminal receiving passages, a cavity intermediate the passages for receiving the body of the component, a groove in the housing outwardly of each passage for receiving a respective lead of the component when the component body is in the body receiving cavity, a cover integrally hinged to the housing and including a pair of flanges, each covering a groove and component lead therein when the cover is in closed position, the cover further including a pair of cavities, each cavity opening to one end of a respective passage of the housing when the cover is in closed position, cooperating means on the cover and housing for latching the cover in closed position, a flap integrally hinged to the cover, and means on the flap extending transversely into the terminal receiving passages of the housing when the flap is in closed position and engageable with terminals in the passages to lock the terminals against withdrawal and maintain the flap in closed position relative to the housing.

3. A one piece housing for packaging an electrical component body and connecting the component leads to terminals after packaging comprising, in combination, a housing of insulating material having a pair of open ended terminal receiving passages, a cavity intermediate the passages for receiving the body of the component, a groove in the housing outwardly of each passage for receiving a respective lead of the component when the component body is in the body receiving cavity, a cover integrally hinged to the housing and including a pair of flanges, each covering a groove and component lead therein when the cover is in closed position, the cover further including a pair of cavities and a viewing opening therethrough intermediate the cavities, each cavity opening to one end of a respective passage of the housing when the cover is in closed position, the cover opening permitting viewing of the component body when the cover is in closed position, cooperating means on the cover and housing for latching the cover in closed position, a flap integrally hinged to the cover, and means on the flap extending transversely into the terminal receiving passages of the housing when the flap is in closed position and engageable with terminals in the passages to lock the terminals against withdrawal and maintain the flap in closed position relative to the housing.

* * * * *